United States Patent [19]

Shiga

[11] Patent Number: 5,235,291
[45] Date of Patent: Aug. 10, 1993

[54] FABRICATION DEVICE WHICH AUTOMATICALLY POSITIONS A DIELECTRIC RESONATOR WITH RESPECT TO A SUBSTRATE FOR MOUNTING OF THE RESONATOR THEREON IN ACCORDANCE WITH A MONITORED OSCILLATION OUTPUT SIGNAL

[75] Inventor: Nobuo Shiga, Yokohama, Japan

[73] Assignee: Sumitomo Electric Industries, Ltd., Osaka, Japan

[21] Appl. No.: 872,997

[22] Filed: Apr. 24, 1992

[30] Foreign Application Priority Data

May 2, 1991 [JP] Japan .................................. 3-100890

[51] Int. Cl.⁵ .......................... H03B 5/18; G01R 23/04
[52] U.S. Cl. ........................................ 331/44; 331/96;
  331/107 SL; 29/593
[58] Field of Search ..................... 331/96, 107 SL, 44;
  324/74, 130, 600, 629, 633; 364/571.1; 29/593

[56] References Cited

U.S. PATENT DOCUMENTS 4,591,806  5/1986  Havens .................... 331/107 SL

FOREIGN PATENT DOCUMENTS 129251  12/1984  European Pat. Off. .

OTHER PUBLICATIONS

Patent Abstracts of Japan, vol. 006, No. 016 (E-092) Jan. 29, 1982 & JP-A-56 138 305 (Sanyo Electric Co. Ltd).
Patent Abstracts of Japan, vol. 009, No. 280 (E-356) Nov. 8, 1985 & JP-A-60 123 106 (Nippon Denki KK).
Patent Abstracts of Japan, vol. 010, No. 050 (E-384) Feb. 27, 1986 & JP-A-60 204 104 (Fujitsu KK).
Patent Abstracts of Japan, vol. 010, No. 087 (E-393) Apr. 5, 1986 & JP-A-60 232 705 (Nippon Denki KK).
Philip G. Wilson and Richard D. Carver, "an Easy-To-Use FET DRO Design Procedure Suited To Most CAD Programs", *IEEE MTT-S Digest*, pp. 1033–1036, (1989).

Primary Examiner—David Mis
Attorney, Agent, or Firm—Beveridge, DeGrandi, Weilacher & Young

[57] ABSTRACT

There is disclosed a device for fabricating an oscillating apparatus by mounting a dielectric resonator on a substrate having a previously-mounted oscillating unit and a previously-provided microstrip line connected to the oscillating unit for supplying oscillation outputs. The device includes a support element for supporting the dielectric resonator, a positioning mechanism for moving the dielectric resonator to a position with respect to the substrate, a monitoring element for monitoring an oscillation output from the oscillating unit and a control element for controlling a drive element of the positioning mechanism in accordance with an output from the monitoring means.

11 Claims, 5 Drawing Sheets

FABRICATION DEVICE WHICH AUTOMATICALLY POSITIONS A DIELECTRIC RESONATOR WITH RESPECT TO A SUBSTRATE FOR MOUNTING OF THE RESONATOR THEREON IN ACCORDANCE WITH A MONITORED OSCILLATION OUTPUT SIGNAL

BACKGROUND OF THE INVENTION

1. Field of the Invention

This invention relates to a device for fabricating an oscillating apparatus, such as a local oscillating circuit for use in converters and measuring apparatuses of satellite broadcasting receivers.

2. Related Background Art

The recent rapid development of information network systems has accompanied the rapid increase of the demand for satellite broadcasting and broadcasting systems. Higher frequency bands and increasingly required. The demand for oscillators which are used as local oscillators in downconverters for converting high frequency signals to lower frequency signals has increased.

Conventionally oscillators for this purpose have been provided by MMICs (Microwave Monolithic Integrated Circuits) having all the devices including FETs necessary for the oscillators integrated monolithically on one semi-insulating GaAs substrate, or by MHICs (Microwave Hybrid Integrated Circuits) assembling GaAs FETs and other components which are discrete from one another. These oscillators are connected to microstrip lines, and the microstrip lines are positioned adjacent to dielectric resonators for electromagnetic coupling, so that a high output power at a required frequency, i.e., a highly pure spectrum can be obtained.

In this case, the position of the dielectric resonators with respect to the microstrip lines cannot be fixed at a constant position because of fabrication deviations, such as FET parameters and so on, and in positioning the dielectric resonators, their positions are individually adjusted manually.

As described above, in the conventional oscillators for use in converters of satellite broadcasting receivers, dielectric resonators are manually positioned with respect to the microstrip lines. But since the dielectric resonators are about 5 mm-diameter cylinders, the operation of gripping such dielectric resonators with pincers are so subtle and difficult that this operation can be done only by skilled operators, and the productivity is extremely low. This has been a problem.

SUMMARY OF THE INVENTION

An object of this invention is to automate the device fabricating the oscillators to improve the productivity of the oscillators.

The oscillator unit may be an MMIC having all the devices necessary for the oscillator unit, such as a FET, a condenser, an inductor and so on, integrated monolithically on a substrate of, e.g., semi-insulating GaAs, or may be a MHIC assembling a FET, and other components which are discrete from one another.

The relative position between the dielectric resonators and the microstrip lines are adjusted by controlling a positioning mechanism by control means, monitoring an oscillation output the oscillating unit by monitoring means, and when the oscillation output is monitored at a maximum power, the position of the dielectric resonator with respect to the microstrip line is optimum.

It is further object of the present invention to provide a device for fabricating an oscillating apparatus by mounting a dielectric resonator on a substrate having an oscillating unit beforehand mounted on and a microstrip line connected to the oscillating unit beforehand formed on for taking out oscillation outputs, the device comprising support means for supporting the dielectric resonator a positioning mechanism for moving the dielectric resonator to an optional position of the substrate monitoring means for monitoring an oscillation output of the oscillating unit, and control means for controlling drive means for the positioning mechanism in accordance with an output of the monitoring means.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
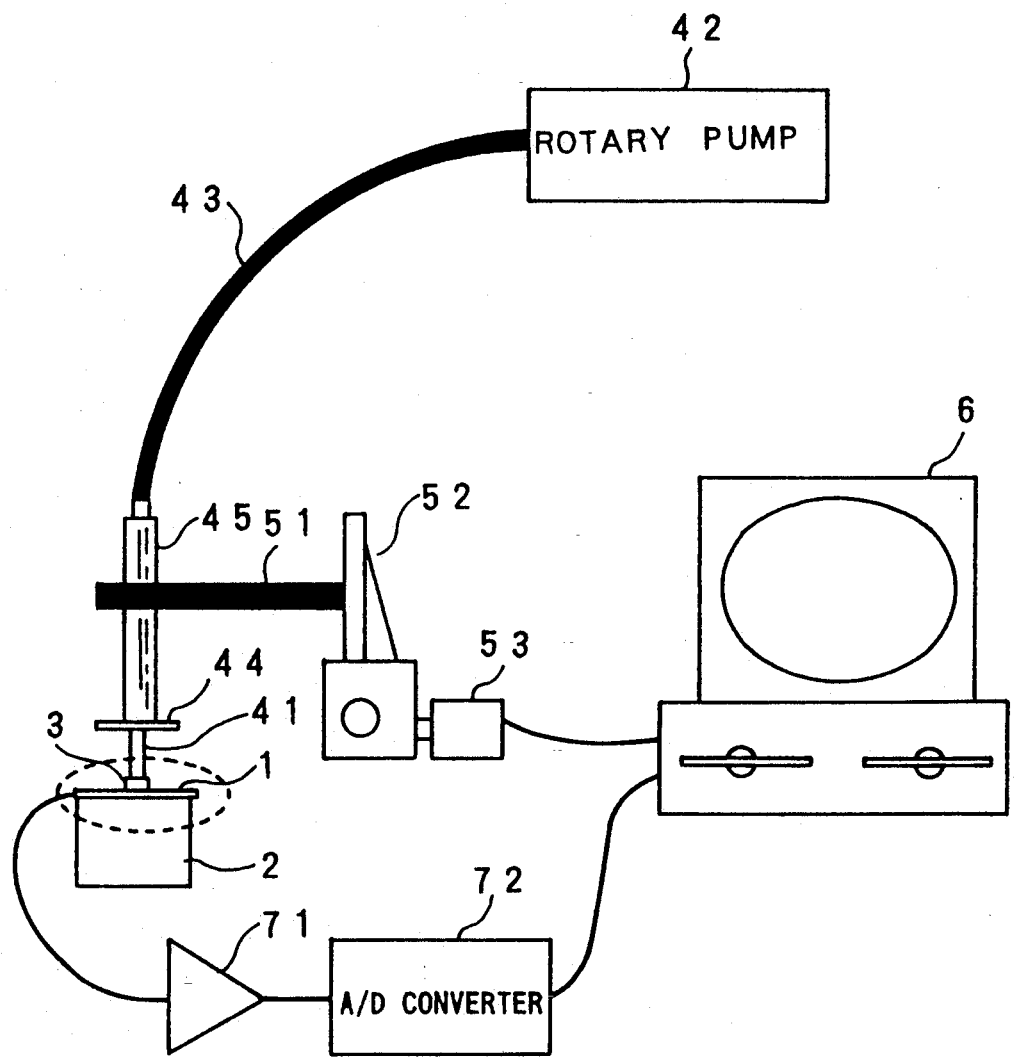
FIG. 1 is a block diagram of the device for fabricating an oscillating apparatus according to an embodiment of this invention.
Figure 2A:
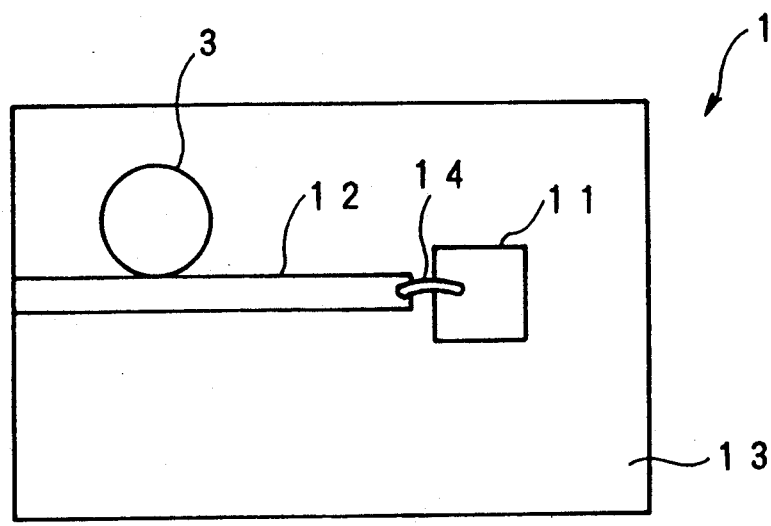
FIGS. 2A, 2B is a plan view, and a front view of an oscillating unit substrate 1.
Figure 2B:
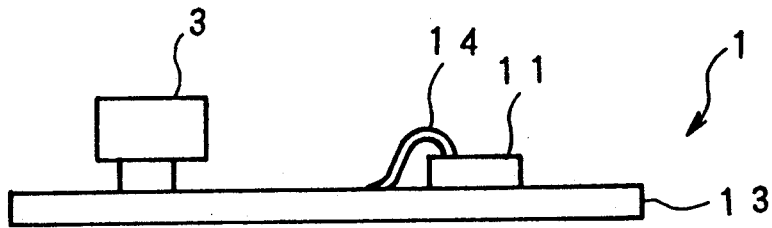

FIG. 1 is a general block diagram of the device. An oscillating apparatus comprises, as shown in FIG. 2, an MMIC chip 11 mounted on a substrate 13, as of ceramics or others, with a microstrip line 12 formed on, and the MMIC chip 11 is connected to the microstrip line by a wire 14. The MMIC chip 11 has all the elements intrinsically necessary for an oscillator, such as a FET, a resistor, a condenser, an inductor, etc., integrated thereon by growing the respective layers on semi-insulating GaAs substrate by, e.g., OMVPE (Organic Metal Vapor Phase Growth). To facilitate the fabricating operation, it is preferable that the substrate 13 of the oscillating apparatus is fixed to a block 2 of, e.g., brass, having some weight.

Figure 3:
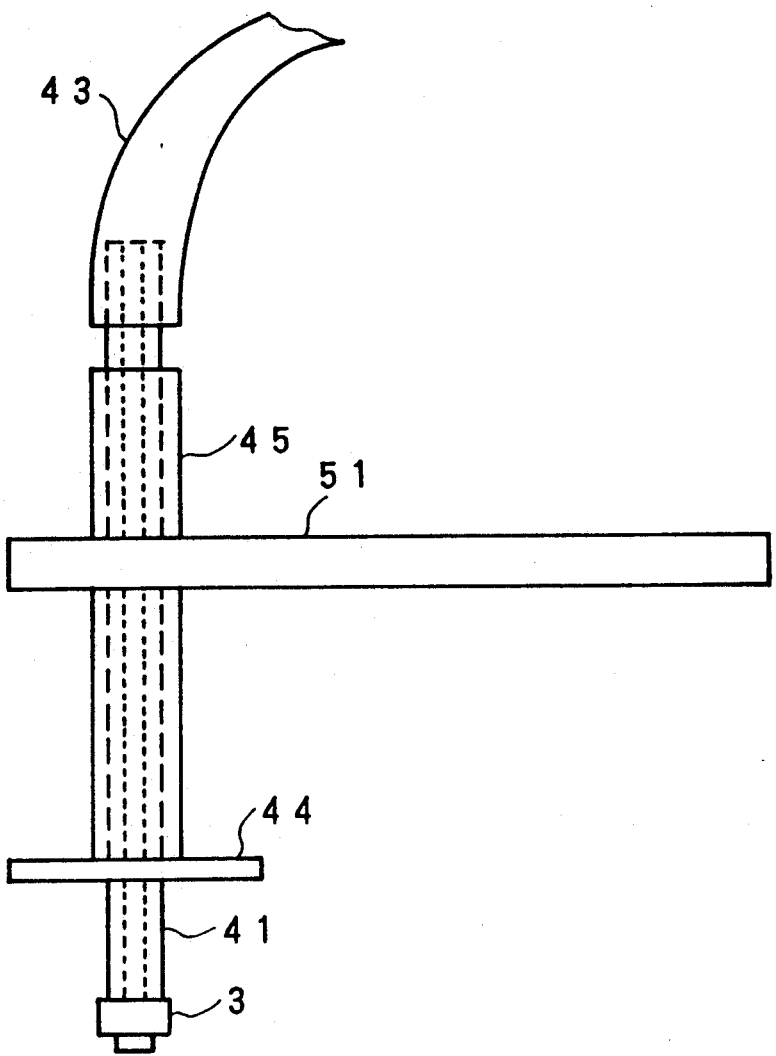
FIG. 3 is a front view of a support mechanism of a dielectric resonator 3.

A dielectric resonator 3 is positioned with respect to the substrate 13. As the dielectric resonator 3, for example, MDD type resonator manufactured and sold by Nippon Tokush Kogyo K.K. can be used. The MDD type resonator has, for example, 4.5 to 6.5 mm outerdiameter, 2.0 to 3.0 mm height and the resonant frequency is 12.0 to 8.5 GHz. It is not suitable that the supporting means for the dielectric resonator 3 is metal, and preferably the means is made of a material of low dielectric constant, such as Teflon, glass or others. An about 3 mm-outer diameter cylindrical collet 41 is made of such material (e.g., Teflon) as shown in FIG. 3, and this collet 41 is evacuated at one end by a rotary pump 42 to vacuum-attract the dielectric resonator 3. Reference numeral 43 indicates a pipe of, e.g., vinyl.

Figure 4:
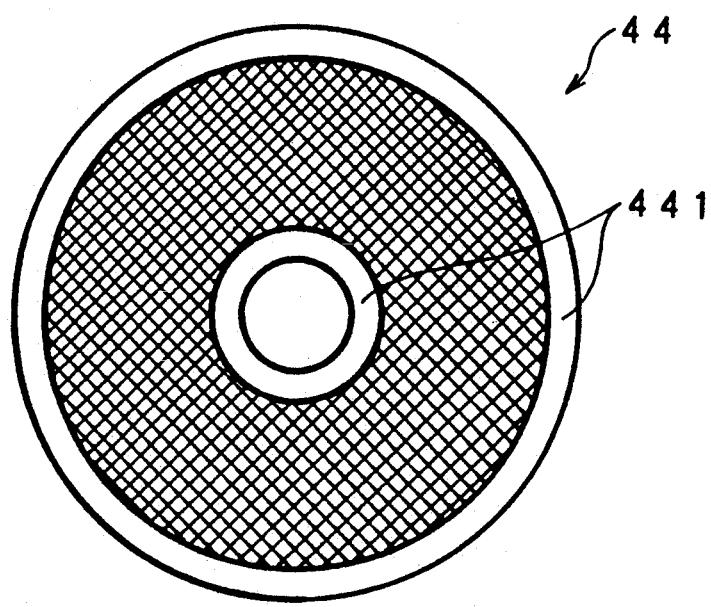
FIG. 4 is a front view of a disk 44.

The dielectric resonator 3 requires a metal roof at a position some millimeters above at least the top of the resonator 3. Without the roof, the resonator 3 does not often resonate. An about 1 to 3 cm-diameter metal disk 44 is provided on the Teflon (Trademark of Du pont Inc.) pipe 41 substantially at the middle thereof. Depending on circumstances, the height of the disk 44 is adjustable, and as shown in FIG. 4, the disk 44 has a hole having the same diameter as the outer diameter of the Teflon pipe 41. The disk 44 may be made of a usual plate. But more preferably the disk 44 is made of a metal mesh as shown in FIG. 4, so that what is happening below the disk 44 can be seen through the disk 44, which is good for the fabricating operation. In the case a metal mesh is used, as shown in FIG. 4, the metal mesh is supported by two annular rings 441, or adhered to a transparent acrylic plate.

Since Teflon or glass pipes per se are fragile, the part of the pipe 41 upper the disk 44 is reinforced with a pipe 45 of metal or others. The pipe 45 is gripped by a support stay 51, and the support stay 51 is connected to a manipulator 52 adjustably along the XYZ-axes. It is sufficient that the precision of the adjustability is 10 μm as high as that of the manipulators generally used in optical experiments.

The manipulator 52 which is a mechanism for the positioning is controlled by a drive motor 53 with respect to its movement along at least two axes (X and Y axes) of three X, Y and Z axes, and the motor 53 is controlled by a computer 6.

An oscillation output of the oscillating unit (MMIC chip) 11 taken out from the microstrip line 12, is amplified by an amplifier 71, then A/D converted by an A/D converter 72, and is supplied to the computer 6. The computer 6 executes a program to control the motor 53 so that this monitored oscillation output power becomes maximum.

Figure 5:
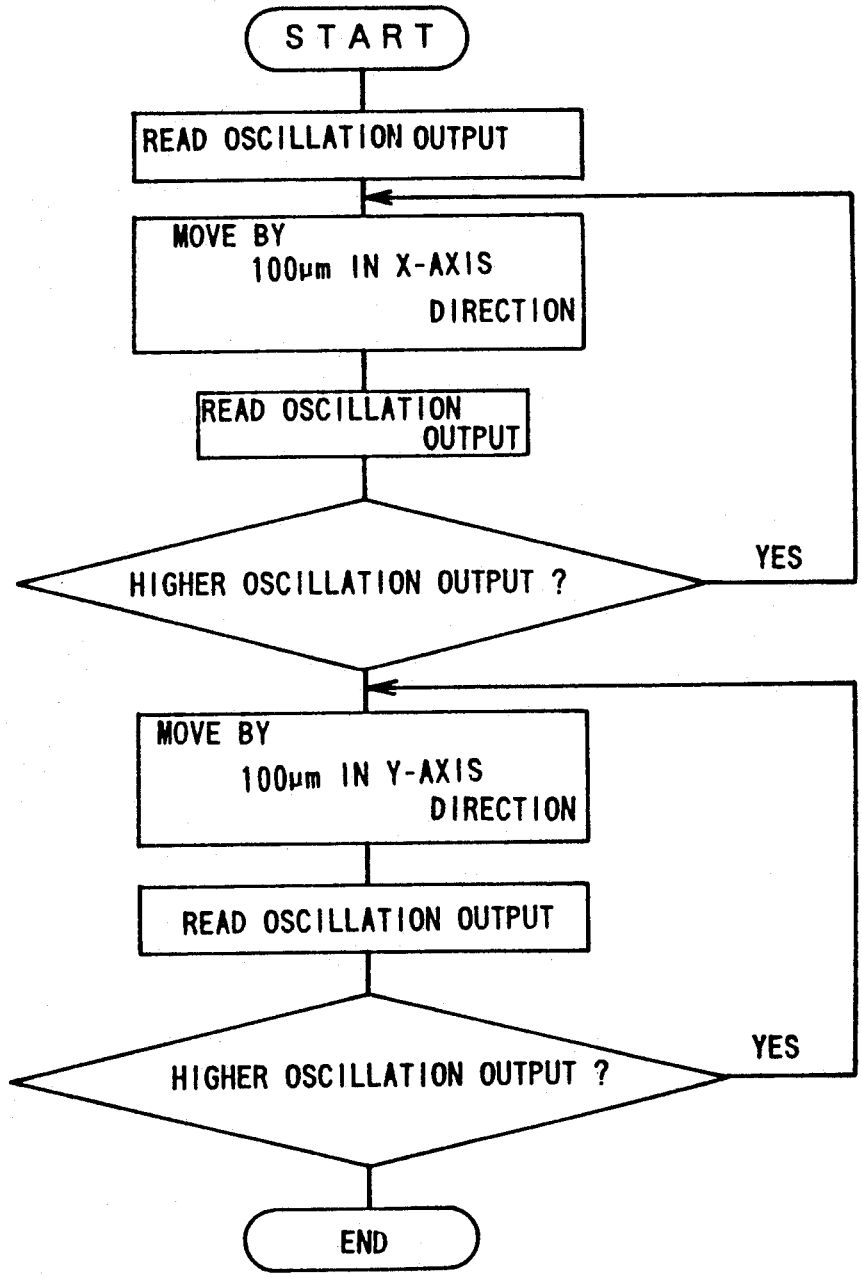
FIG. 5 is a flow chart of a control program executed by a computer 6.
Figure 6:
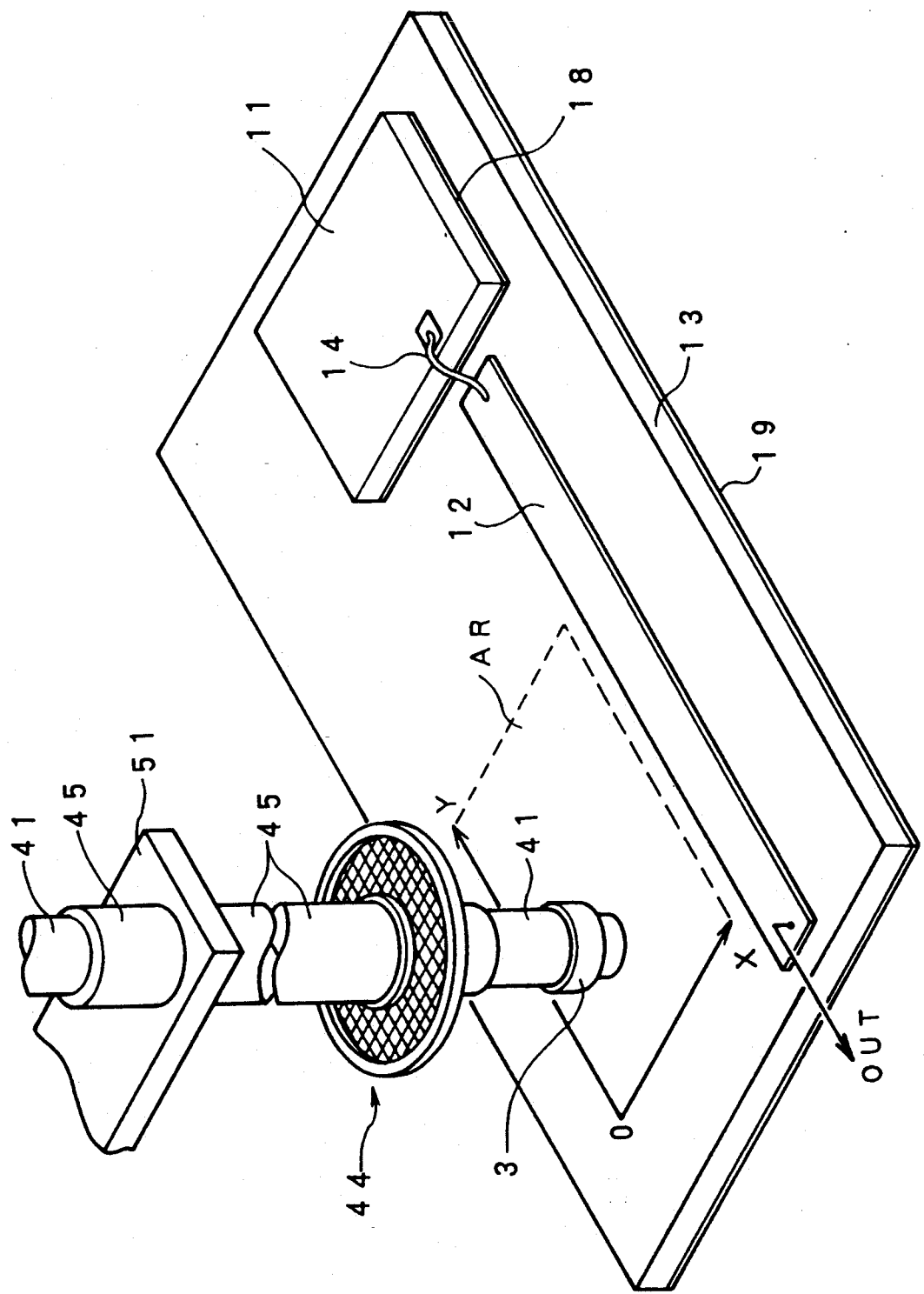
FIG. 6 is a perspective view of the fabrication device according to the embodiment.

FIG. 5 is a flow chart of this control. FIG. 5 shows only the basic part, but the details are as follows. First, maximum movement ranges of the manipulator 52 in the X- and the Y-axis directions are set. The scanning is conducted only in these ranges. Such scanning is shown in FIG. 6.

The dielectric resonator 3 is vacuum-attracted by the collet 41 and is moved in the X axis- and the Y axis-directions in accordance with movements of the support stay 51. The area where the dielectric resonator 3 can move is the one indicated by the mark AR in FIG. 6, and the dielectric resonator 3 is initially positioned at the origin 0.

A grounded metal layer 19 is formed on the underside of the substrate 13, and the MMIC chip 11 is dibonded to the substrate 13 by an adhesive layer 18. An oscillation output (OUT) to the amplifier 71 constituting the monitor circuit is taken out from the end of the microstrip line 12.

Electric power is supplied to the MMIC chip 11, and the dielectric resonator 3 is positioned at the origin. The dielectric resonator 3 and the substrate 13 may be in contact with each other, but since their contact tends to cause damages, it is preferable to provide a slight space.

It is also possible to arrange so that both come into contact with each other during the monitoring, and come out of the contact during the movement of the dielectric resonator.

Then the resonator 3 is moved by a 100 μm-step in the X-axis direction over the set area AR while an oscillation output is being read at a required frequency, so as to find a position where the oscillation output is monitored at a maximum power. If no oscillation output is monitored during this movement, it means that there is no oscillation at the position on the Y axis corresponding to this position on the X axis. Then the resonator 3 is moved by a 100 μm step in the Y-axis direction, and the above-described monitoring in the X-axis direction is repeated.

An oscillation output can be monitored at a position on the Y axis corresponding to a position on the X axis. Then a point at the position on the Y axis where the oscillation output is monitored at a maximum power is searched. The flow chart of FIG. 5 is an algorithm following the arrival at a position on the Y axis where an oscillation output has been monitored. When the point of a maximum power of the oscillation output is located, the position on the Y axis is optimized by the same algorithm. And the position of the dielectric resonator 3 is optimized. The precision of positioning the dielectric resonator 3 is further improved by repeating the same processing, using a 10 μm-movement step.

When an optimum position is located, the dielectric resonator 3 is secured to the position by means of an adhesive or others. For example, the support stay 51 is driven upward to leave the resonator 3 from the substrate 13 to apply an adhesive there, and the resonator 3 is put back to the position. And the resonator 3 can be secured.

In the above-described embodiment, the dielectric resonator 3 scans in both the X-axis and the Y-axis direction, but it is possible that the resonator 3 scans only in one of these directions. In the embodiment, the X-axis is set perpendicular to the microstrip line, but it is possible to set the X-axis parallel with or diagonal to the microstrip line.

As described above, according to this invention, in the fabrication of an oscillating apparatus, the positioning operation of a dielectric resonator with respect to a microstrip line can be automated by the device comprising means for supporting the dielectric resonator, a mechanism for positioning the supported dielectric resonator at an optional position on a substrate having an oscillating unit and the microstrip line, means for monitoring an oscillation output of the oscillating unit, and means for controlling the dielectric resonator positioning mechanism.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A device for mounting a dielectric resonator on a substrate having a previously-mounted oscillating unit and a previously-provided microstrip line connected to the oscillating unit for supplying oscillation outputs, the device comprising:

monitoring means for monitoring an oscillation output from the oscillating unit, and providing a monitoring signal;

support means for holding the dielectric resonator above the substrate during movement of the resonator by the device;

positioning means comprising manipulator means connected to the support means for manipulation thereof, and drive means for driving the manipulator means; and control means for controlling the drive means to drive the manipulator means to the position for mounting the dielectric resonator in accordance with a monitoring signal from the monitoring means.

2. A device according to claim 1, wherein the oscillating unit is a microwave monolithic integrated circuit chip.

3. A device according to claim 1, wherein the oscillating unit is a microwave hybrid integrated circuit comprising a plurality of component chips.

4. A device according to claim 1, wherein the support means includes a collet for vacuum-attracting the dielectric resonator.

5. A device according to claim 4, wherein an electrically conductive member is attached to the collet above the dielectric resonator.

6. A device according to claim 1, wherein the positioning means includes the manipulator means for moving the dielectric resonator as it is held in two axis-directions which are in parallel with the substrate and which intersect each other.

7. A device according to claim 1, wherein the monitoring means monitors the oscillation output through the microstrip line.

8. A device according to claim 1, wherein the monitoring means monitors power in the oscillation output at a required frequency.

9. A device according to claim 8, wherein the control means so controls the drive means that the oscillation output is monitored at a maximum power.

10. A device according to claim 6, wherein the control means controls the drive means to move the dielectric resonator as it is held in a predetermined direction; and to stop the dielectric resonator at a position where the monitor means has monitored the oscillation output of a required frequency at a maximum power.

11. A device according to claim 6, wherein the control means controls the drive means to move the dielectric resonator as it is held in one of the two axis-directions; to stop the dielectric resonator at a position where the monitor means has monitored the oscillation output of a required frequency at a maximum power; and then to move the dielectric resonator as it is held in the other of the two axis-directions and to stop the dielectric resonator at the position monitored by the monitoring means where the oscillation output of the required frequency has been monitored at a maximum power.

* * * * *